United States Patent
Zapf et al.

(10) Patent No.: US 6,852,937 B2
(45) Date of Patent: Feb. 8, 2005

(54) INDUCTIVE POSITION SENSING SWITCHING DEVICE

(75) Inventors: Martin Zapf, Creussen (DE); Alexander Kugler, Auerbach (DE); Gerhard Hahn, Pegnitz (DE)

(73) Assignee: Cherry GmbH, Auerbach (DE)

( * ) Notice: Subject to any disclaimer, the term of this patent is extended or adjusted under 35 U.S.C. 154(b) by 0 days.

(21) Appl. No.: 10/141,799

(22) Filed: May 8, 2002

(65) Prior Publication Data

US 2002/0175060 A1 Nov. 28, 2002

(30) Foreign Application Priority Data

May 23, 2001 (DE) .......................................... 101 25 278

(51) Int. Cl.$^7$ ................................................ H01H 9/06
(52) U.S. Cl. .................... 200/61.88; 335/132; 335/205; 335/6; 335/131; 335/202; 335/151
(58) Field of Search .......................... 200/61.58, 61.85, 200/61.88, 61.58 R; 335/131, 132, 202, 205, 151, 6; 74/469, 473

(56) References Cited

U.S. PATENT DOCUMENTS 5,198,789 A * 3/1993 Taylor ........................ 335/132

FOREIGN PATENT DOCUMENTS

| DE | 3619238 | 3/1987 |
|----|---------|--------|
| DE | 3734177 | 5/1988 |
| DE | 3735694 | 5/1988 |
| DE | 3743259 | 6/1989 |
| DE | 69405052 | 12/1994 |
| DE | 19806529 | 8/1999 |
| GB | 1452132 | 10/1976 |

* cited by examiner

Primary Examiner—Lincoln Donovan
Assistant Examiner—Jennifer A. Poker
(74) Attorney, Agent, or Firm—Joradn & Hamburg LLP

(57) ABSTRACT

A switching device, in particular a position sensing switching device, generates switching signals. The position sensing switching device comprises at least one switching unit and at least one activation unit, the switching unit reacting to a relative spacial displacement of the switching unit and the activation unit with respect to one another by outputting appropriate switching signals. The switching unit is embodied as an inductive switching unit and the activation unit is embodied as an inductive damping unit. The position sensing switching device according to the invention is preferably applied in gear-speed-changing units for automatic gearboxes.

16 Claims, 7 Drawing Sheets

INDUCTIVE POSITION SENSING SWITCHING DEVICE

BACKGROUND

The present invention relates to a switching device, in particular a position sensing switching device, which generates switching signals.

Different switching devices are known from the prior art, most switching devices using mechanical switches. However, a significant disadvantage of these switching devices is that they have mechanical switching units or mechanical microswitches and mechanical sliding contacts for generating switching signals. The mechanical switches have the disadvantage that they do not operate without wear. Their service life is limited, on the one hand, by material erosion of contacts, by changes in material (oxidation) and by deposition on the switching contacts which are caused by mechanical friction, electrical overloading or the occurrence of an arc during the switching-off or switching-over process. The vibrations of the entire gate-type-gear changing unit also lead to increased wear of of the sliding contacts and sliding tracks of the mechanical sliding switches.

Other switching units which eliminate the disadvantageous property of the mechanical switching contacts are known from the prior art. An example of such a wear-free switching contact is an inductive switching contact. Such an inductive switching contact is described in the patent application "position sensor" with the official number EP 00 101 661.7 submitted to the European Patent Office on 1 Feb. 2000. The aforesaid European Patent Application has the same applicant as this application.

SUMMARY

The object of the present invention is to provide a switching device or a position sensing switching device which overcomes the aforesaid disadvantage of the wear occurring with mechanical switch elements of a conventional mechanical switching device by using wearfree switching units. A further advantage of the present invention is to provide a position sensing switching device which permits reliable monitoring of the operational capability of the position sensing switching device and/or reliable sensing of a selected switched position.

The position sensing switching device according to the invention comprises at least one switching unit and at least one activation unit, the switching unit reacting to a relative spacial displacement of the switching unit and of the activation unit with respect to one another by outputting switching signals (corresponding to the relative displacement). The difference between the position sensing switching device according to the invention and other position sensing switching devices known from the prior art is that the switching unit has been embodied as an inductive sensor unit and the activation unit has been embodied as an inductive damping unit.

A particular advantage of sensing the present invention is obtained using a position sensing switching device in which either one activation unit simultaneously activates two or more switching units or the position sensing switching device has at least two activation units and at least three switching units, at least two of the activation units simultaneously activating at least two of the switching units.

The method of operation of the position sensing switching devices according to the invention is clarified by the example in the following figures.

DETAILED DESCRIPTION

Figure 1:
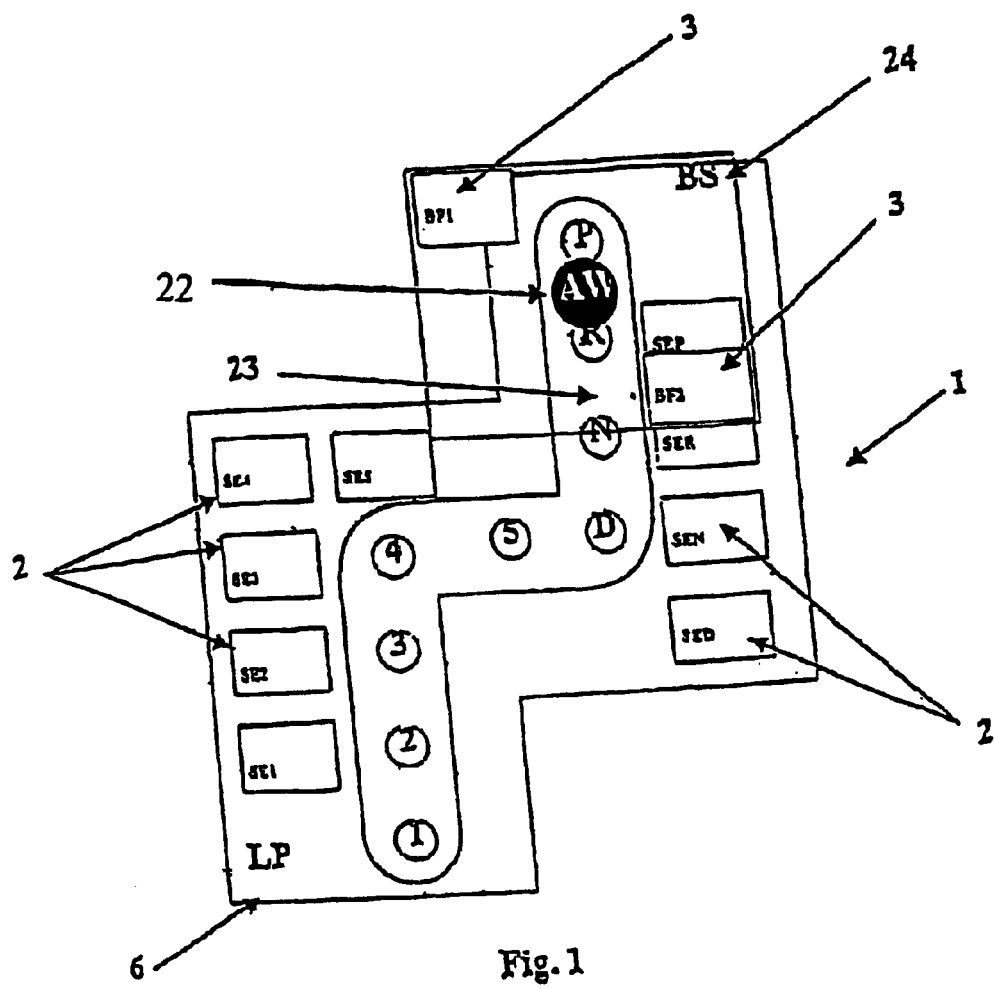
FIG. 1 is a general schematic view of a preferred embodiment of a position sensing switching device according to the invention.

FIG. 1 is a general schematic view of a preferred embodiment of a position sensing switching device 1 according to the invention in the form of a gear-speed-changing unit for generating gear-speed-changing signals for an automatic gearbox. The position sensing switching device 1 has four switching units 2 and at least one activation unit 3., the activation unit 3 being displaceable with respect to the switching units 2. The relative displacement of the switching units 2 and of the activation unit 3 with respect to one another takes place both in the horizontal and vertical directions. Displacement movements are thus understood both to be a pure displacement movement and a tilting movement. The switching units 2 are embodied as inductive sensor units and the activation unit 3 is embodied as an inductive damping unit whose method of operation is clarified using FIGS. 2 and 3.

Figure 2:
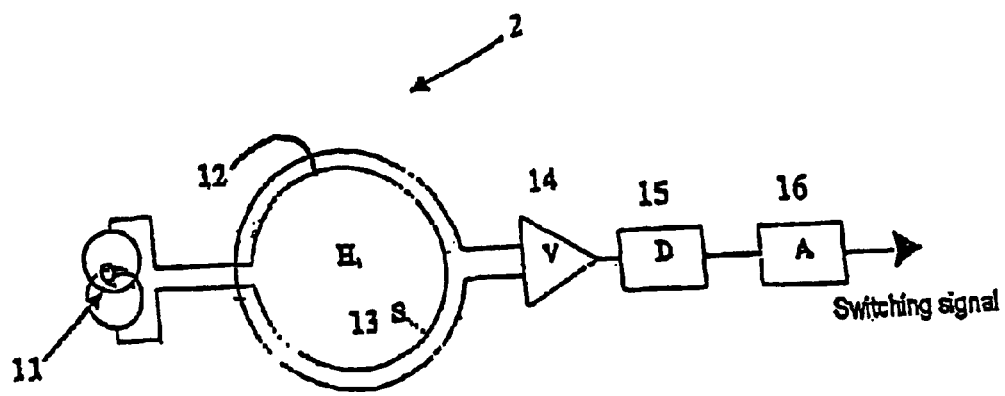
FIG. 2 is a functional block diagram of a preferred embodiment of an inductive switching unit.

FIG. 2 shows a preferred embodiment of one of the inductive switching units 2. The inductive switching unit 2 is composed of an oscillating power source ($Q^-$) 11, an exciter loop (E) 12, a sensor loop (S) 13, a voltage amplifier (V) 14, an amplitude detector (D) 15 and an evaluation unit (A) 16. All or some of the components 11 to 16 of the inductive switching unit 2 may be arranged on a printed circuit board 6 in a planar fashion. The exciter loop 12 is surrounded here by the sensor loop 13, or vice versa. Exciters 12, such as the sensor loop 13, can also be embodied with several windings.

Figure 4:
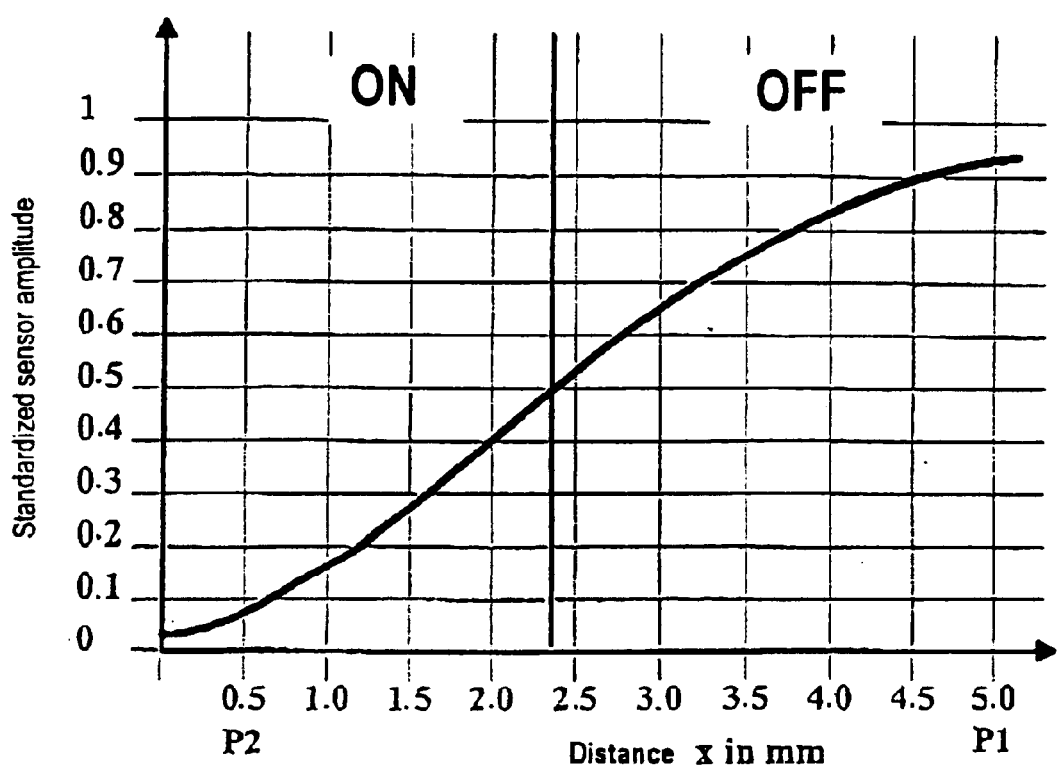
FIG. 4 is an example of a switching criterion of the inductive switching unit.

The inductive switching unit 2 functions as follows: the oscillating power source ($Q^-$) 11 impresses into the exciter loop 12 an electric current which alternates over time. The electric current generates a magnetic field $M_1$ which alternates over time and which has the field strength $H_1$ (x, y, z). The magnetic flux which alternates over time and which acts on the sensor coil 13 brings about a voltage in the sensor coil 13, as in any electrical conductor, which is placed in the vicinity of the exciter coil 12. The sensor voltage is amplified by the amplifier 1a, the amplitude is determined with the detector 15 and the evaluation unit 16 compares it with a switching criterion K. FIG. 4 shows an example of the switching criterion K. In simple switches, the evaluation can be carried out by means of a comparator or a Schmitt trigger. The evaluation unit 16 for multiple switches is usually in the form of a microcontroller which passes on the switching information to control electronics or power electronics via an interface (CAN, LIN, etc.).

Figure 3:
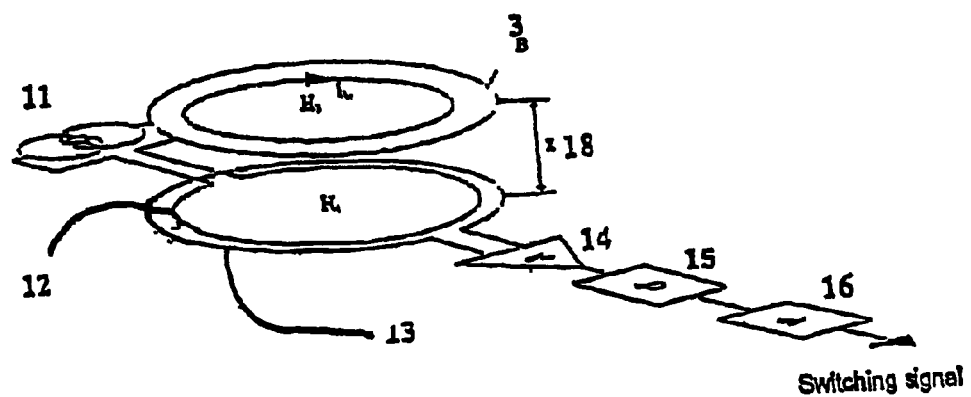
FIG. 3 is a schematic view of a method of operation of the inductive switching unit.

FIG. 3 is a schematic view of the method of operation of the inductive switching unit 2. If a conductive layer, plate or loop is placed, as an activation unit (B) 3 in the vicinity of the exciter coil 12, the magnetic field $H_1$ also penetrates this activation unit 3 and, according to Lenz, induces a voltage which brings about an eddy current $I_{ks}$, which flows in the opposite direction to the current in the exciter coil 12. This short-circuit current which alternates over time generates a magnetic field $M_2$ which acts in opposition to $M_1$, and, when the fields are superimposed on one another, this has an effect ranging from reducing to even extinguishing the entire magnetic field which penetrates the sensor coil 13. This leads to a reduction in the sensor voltage and thus in the amplitude. This is compared with the switching criterion K by the evaluation unit 16 and triggers a switching function. The reduction in the sensor voltage by the actuator B can also be referred to as damping.

The damping of the sensor signal is dependent on the distance (x) 18 of the activation unit 3, embodied as an inductive damping unit, from the sensor loop 13: where x=0 the sensor signal is damped to a maximum degree. The inductive damping unit can be constructed from materials with different degrees of electrical conductivity, for example from metal, from a conductive plastic etc. The damping is also dependent on the degree of overlap between the sensor loop 13 and the activation element 3 or the inductive damping unit. If the inductive damping unit overlaps the entire area of the outer loop 13, the degree of coverage is 100% and the amplitude of the sensor signal is minimal. Two switching systems are therefore possible for the switch:

The degree of coverage G is kept to a defined magnitude and the distance (x) between the activation element 3 and sensor loop 13 varies or the distance (x) 18 is kept constant and the degree of overlap G is changed, a combination of both is of course possible.

The inductive switching unit 2 can also be extended to such an extent that one exciter coil 12, surrounds a plurality of sensor coils 13 which are then connected to the amplifier via an analogue multiplexer AMUX. It is also conceivable to connect a plurality of exciter coils to the power source Q in a series connection, which exciter coils surround one or more sensor coils, such as is shown, for example in FIG. 5.

It is also conceivable to provide two activation units 3 and sensor coils 13 per switching position in order to provide a higher degree of redundancy by means of a plausibility interrogation. In such a case, both switching signals must be identical at all times.

In addition it is possible to change the evaluation unit 16 in such a way that it does not trigger a switching function by comparison of the sensor voltage with a threshold value but rather triggers it additionally by comparison with the voltage of an adjacent sensor.

With the inductive switching unit 2 it is also possible to construct a pressure switch as follows. The activation unit 3 is mounted on a plunger which can alternately be locked in two positions similarly to a ballpoint pen mechanism. It is also conceivable to configure the mechanics of the pressure switch in such a way that the plunger does not have latching positions but can instead be displaced "freely" with respect to the switching unit or the sensor sliding plane. If the distance between the activation unit 3 and sensor sliding plane is, for example, 5 mm in the (latched) position P1 and 0.5 mm in the (latched) position P2, a standardized amplitude voltage of approximately 0.5 must be set for the switching criterion K for the switching range shown in FIG. 3. However, a pressure switch can also be embodied in such a way that a mechanism changes the degree of coverage G of the activator with respect to the sensor loop 13. The sensor amplitude voltage then depends on the degree G of coverage and must be defined according to its characteristic curve.

Figure 6:
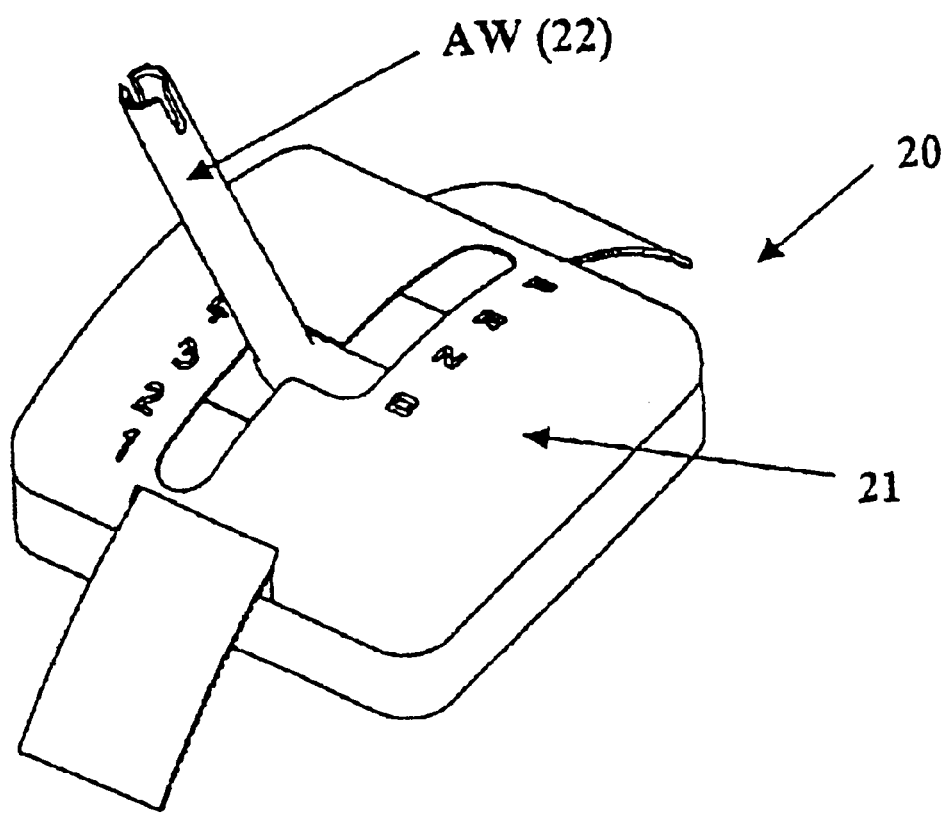
FIG. 6 shows an application example of the position sensing switching device according to the invention.

If a plurality of positions are to be detected, it is expedient to combine a plurality of switching units 2 as a functional unit. A gear-speed-changing device 20 for an automatic gearbox is illustrated in FIG. 6 as an example of the use of a position sensing switching device 1 according to the invention. FIG. 6 shows, by way of example, what is referred to as a gate-type-gear changing unit such as is known generally as the prior art from the user's point of view. However, the use of inductive switches in conjunction with a gate-type-gear changing device is novel. These inductive switch designs are particularly expedient for a logic control, that is to say for a case in which the gear speeds in an automatic gearbox are not selected in a directly mechanical way.

A printed circuit board 6—as illustrated in FIG. 1—is positioned under the panel or cover 21 and, for example, the back lighting of the panel displays ("1", "12" . . . , "P") can be mounted on its upper side. An activator carriage (BS) 24, which rests in a planar fashion on the underside of the printed circuit board LP 6, is connected to the gear lever automatic gear selector lever (AW) 22, which dips through an opening 23 in the printed circuit board, one or more activation units 3, for example two activation units BF1 and BF2 here, which can be displaced at a defined distance to the different inductive switching units (SE*) 2, are provided on the activator carriage (BS) 24. The switching unit SE5 which is represented in FIG. 1, can be used to register a further switched position of the gear selector lever 22. This switched position does not, however, occur in gear-speed-changing devices which are generally known from the prior art. For example, the gear-speed-changing device 20 which is represented in FIG. 6I does not have any gear speed selector lever switched position corresponding to the switching unit SE5. This embodiment of the gear-speed changing device is thus optional, i.e. the switching unit SE5 can be omitted.

Figure 5:
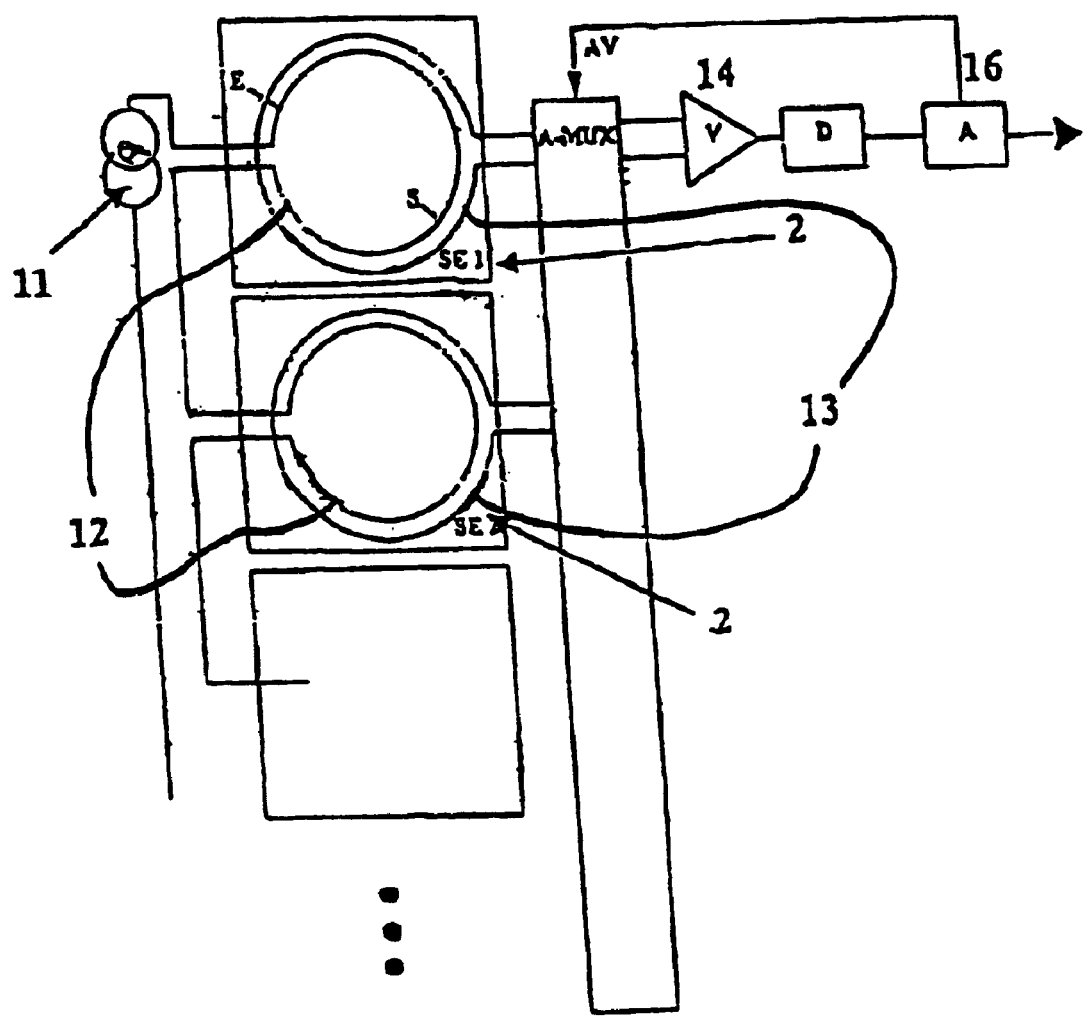
FIG. 5 is a possible embodiment of the inductive switching unit.

When a plurality of inductive switches are combined, the block circuit diagram as illustrated in FIG. 5 is obtained. A current source 11 supplies the exciter coils 12 of a plurality of switching units (SE*) 4. The signals of the sensor loops 13 of a plurality of switching units 2 are connected to the amplifier 14 via a wearfree semiconductor switch (AMUX). The specification of which sensor unit is to be connected is received by AMUX from the evaluation unit 16 via the address specification AV. The evaluation unit 16 outputs the switched state as a function of the address specification. The associated sensor signal is damped as a function of the degree of overlap between the activator area of the activation unit 3 and the sensor unit (SE*) 4. If the switching threshold SW of the signal which can be set at the evaluation unit 16 is reached, the position of the switch is detected as a valid position and switched over.

Figure 7:
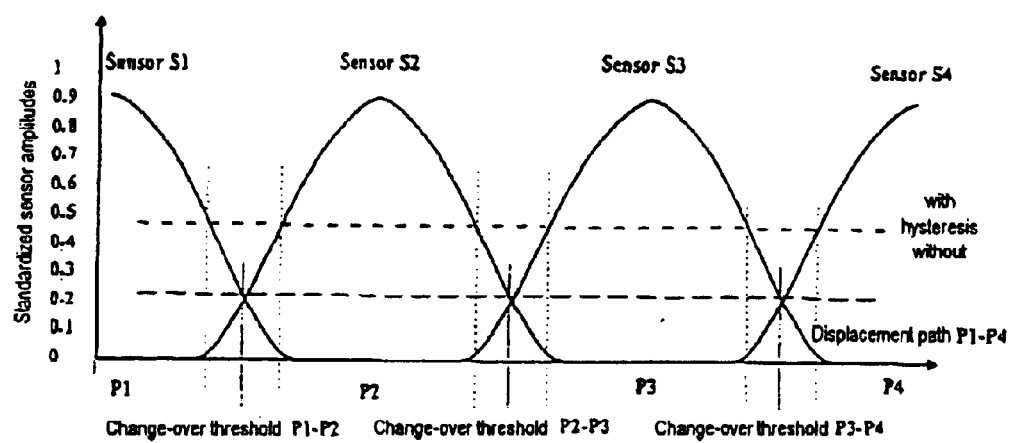
FIG. 7 shows amplitudes of sensor signals for gear-changing operations of an automatic selector lever (represented in FIG. 6) from position 1 to position 4.

An alternative to the previously proposed signal evaluation means with static threshold value comparison is to compare the sensor signals from two adjacent switching units 2. If the signal of a switching unit 2 is lower than that of the adjacent switching unit 2—in which case a hysteresis can also be taken into account, as illustrated in FIG. 7—it is to be assumed that there is to be switching over from one position to the other. This results in switching thresholds being defined in a way which is very resistant to external influences such as temperature drifting of the amplifier 14, of the power source 11 etc.

It is also possible to carry out extremely redundant position detection without a large degree of additional expenditure using the position sensing switching device 1 according to the invention. It is proposed to install at least two switching units 2, instead of one switching unit 2 per switched position, and to continue to compare the signals. Given contradictory results, the evaluation unit 16 should carry out the switching function in such a way that the entire system is placed in the safe state. For this purpose, the printed circuit board 6 can be equipped, for example, with safety switching units (SSE*) 2, as is illustrated schematically in FIG. 8. Here too, the switching unit SE5 and the corresponding safety switching unit SSE5 can be used to register further positions of the gear selector lever 22. For a gear speed-changing device 20 represented in FIG. 6 it is possible to omit such a switched position.

Figure 8:
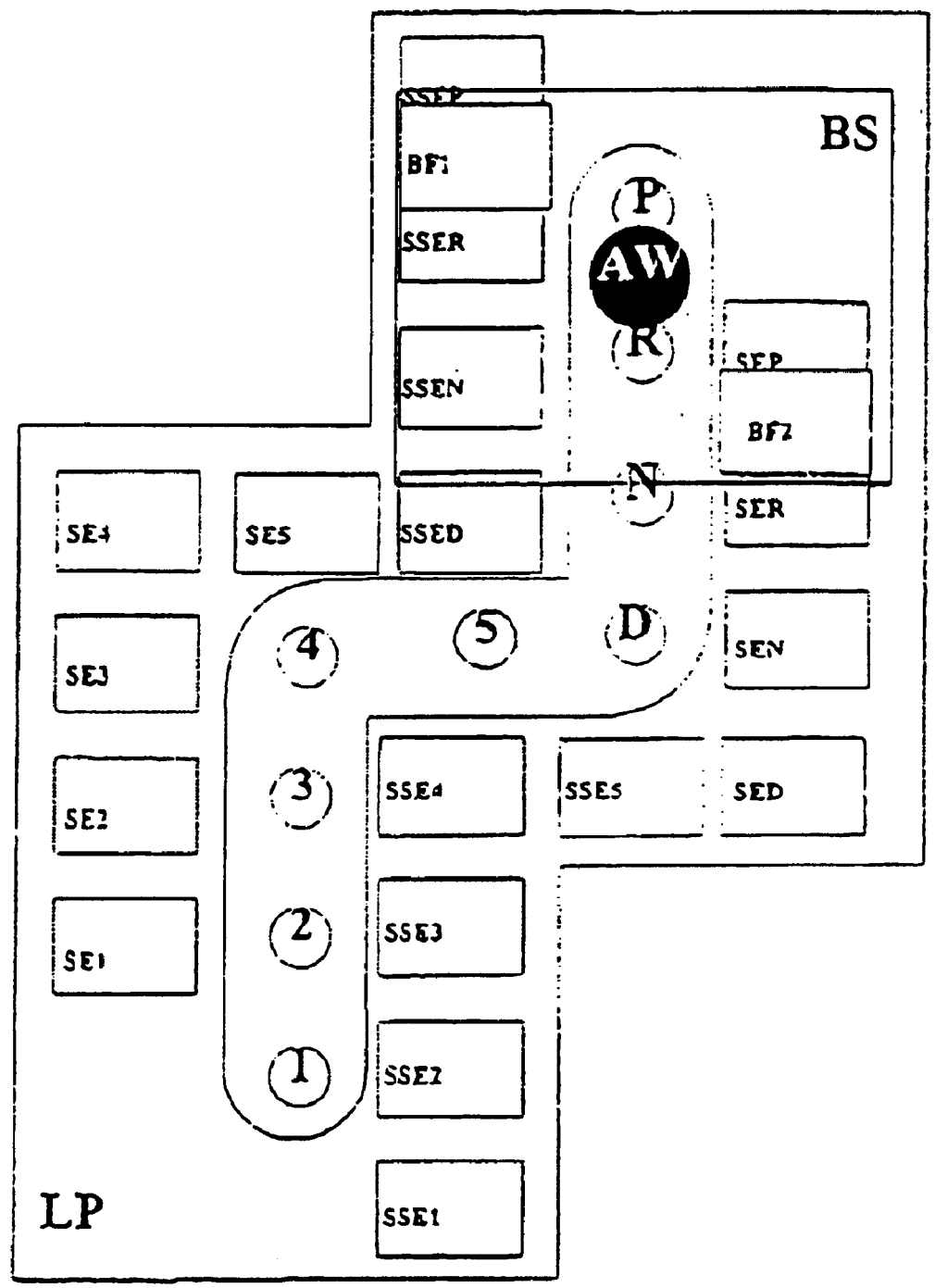
FIG. 8 is a schematic view of a further embodiment of the position sensing switching device according to the invention.

A further embodiment of the position sensing switching device 1 according to the invention is obtained if, instead of pairs composed of one switching unit (SE*) 2 and one safety switching unit (SSE*) 2, as is illustrated in FIG. 8, just one switching unit 2 is used; for example instead of SSEP and SEP, only SSEP; instead of SSER and SER only SER; instead of SSEN and SEN only SSEN etc. In this case, the switching units 2 are accommodated relatively far apart from one another on the printed circuit board 6. This structure of the position sensing switching device 1 makes it possible to avoid the undesired secondary damping effects which are caused by displacements of the activation units 3.

What is claimed is:

1. Position sensing switching device comprising at least one switching unit and at least one activation unit, the at least one switching unit outputting switching signals in response to a relative spatial displacement of the switching unit and of the activation unit with respect to one another, the at least one switching unit including an inductive sensor unit having an exciter loop and a sensor loop and the activation unit including an inductive electrically conductive damping unit interacting with the exciter loop.

2. Position sensing switching device comprising at least two switching units, at least one activation unit, and a common carrier unit for said switching units, the at least two switching units outputting switching signals in response to a relative spatial displacement of the switching unit and of the activation unit with respect to one another, the at least two switching units each including an inductive sensor unit having an exciter loop and a sensor loop, the activation unit including an inductive electrically conductive damping unit interacting with the exciter loop, and said switching units being at least one of positioned on, and integrated into, the common carrier unit.

3. Position sensing switching device according to claim 2 or 3, wherein the activation unit comprises a printed circuit board.

4. Position sensing switching device according to claim 2 or 3, wherein the activation unit is displaceable at least one of horizontally and vertically with respect to the switching unit.

5. Position sensing switching device according to claim 2 or 3, further comprising an activation element, the activation unit being connected to the activation element, the activation element being displaceable with respect to at least one of said switching units, a predetermined position of the activation element with respect to the position switching device corresponding to a predetermined position of the activation unit with respect to said at least one of said switching units.

6. Position sensing switching device according to claim 2 or 3, wherein the activation unit activates a single one of said switching units at a given time.

7. Position sensing switching device according to claim or 3, wherein the activation unit activates at least two of said switching units at a given time.

8. Position sensing switching device according to claim 2 or 3, wherein the position sensing switching device has at least two of said activation units.

9. Position sensing switching device according to claim 7, wherein the position sensing switching device outputs redundant switching signals.

10. Position sensing switching device according to claim 9, further comprising means for monitoring operational capability of the position sensing switching device, said means utilizing the redundancy of the switching signals.

11. Gear-speed-changing unit for generating gear-speed-changing signals for an automatic gearbox, comprising:

a gear shift apparatus having a gear shift member; and the position sensing switching device according to any one of claims 1, 2 or 3, the position sensing switching device being operated by the gear shift member and generating gear-speed-changing signals.

12. Gear-speed-changing unit according to claim 11, further comprising a gate guiding the gear shift member, thereby forming a gate-type-gear changing unit.

13. Position sensing switching device according to claim 8, wherein the position sensing switching device outputs redundant signals.

14. Position sensing switching device according to claim 13, further comprising means for monitoring operational capability of the position sensing switching device, said means utilizing the redundancy of the switching signals.

15. Position sensing switching device according to claim 2 or 3, for use with a gear-speed-changing unit, further comprising a gear-speed-changing-unit for generating gear-speed-changing signals for an automatic gearbox, said gear-speed-changing unit comprising a gear shift apparatus having a gear shift member; such that said gear shift member operates said position sensing switching device, and said position sensing switching device generates said gear-speed-changing signals.

16. Position sensing switching device according to claim 15, for use with a gate type gear-speed-changing unit, further comprising a gate for guiding said gear shift member.

* * * * *